US010321610B2

(12) United States Patent
Ross et al.

(10) Patent No.: US 10,321,610 B2
(45) Date of Patent: *Jun. 11, 2019

(54) FREE COOLING IN HIGH HUMIDITY ENVIRONMENTS

(71) Applicant: Amazon Technologies, Inc., Seattle, WA (US)

(72) Inventors: Peter George Ross, Olympia, WA (US); Osvaldo P. Morales, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/665,177

(22) Filed: Jul. 31, 2017

(65) Prior Publication Data

US 2017/0347499 A1 Nov. 30, 2017

Related U.S. Application Data

(63) Continuation of application No. 15/070,908, filed on Mar. 15, 2016, now Pat. No. 9,723,762.

(51) Int. Cl.
*F24F 3/14* (2006.01)
*F24F 5/00* (2006.01)
(Continued)

(52) U.S. Cl.
CPC ........... *H05K 7/20827* (2013.01); *F24F 3/14* (2013.01); *F24F 5/0014* (2013.01);
(Continued)

(58) Field of Classification Search
CPC . G06F 1/181–1/182; H05K 7/20218–7/20381;
(Continued)

(56) References Cited

U.S. PATENT DOCUMENTS 6,694,757 B1 * 2/2004 Backman ............... F24F 3/153
62/173
9,025,330 B2 * 5/2015 Hodes ............... H05K 7/20754
361/679.47

(Continued)

OTHER PUBLICATIONS

"Cooling Naturally with Phase Change Materials", TROX TECHNIK, Copyright Feb. 2009, printed Feb. 3, 2016, pp. 1-4.
U.S. Appl. No. 13/626,711, filed Sep. 25, 2012.

*Primary Examiner* — Robert J Hoffberg
*Assistant Examiner* — Razmeen Gafur
(74) *Attorney, Agent, or Firm* — Robert C. Kowert; Meyertons, Hood, Kilvin, Kowert & Goetzel, P.C.

(57) ABSTRACT

A data center includes heat producing components and an air handling system that provides reduced relative humidity air to cool the heat producing components. The air handling system includes a thermal storage unit that removes thermal energy from incoming air under a given set of ambient air conditions and releases thermal energy into incoming air under another set of ambient air conditions. Under the given set of ambient air conditions, the thermal storage unit cools the incoming air and causes water vapor to condense out of the incoming air. Under the other set of ambient air conditions, the thermal storage unit releases thermal energy into the incoming air, thus heating the incoming air.

19 Claims, 10 Drawing Sheets

(51) Int. Cl.
| | |
|---|---|
| *F24F 7/08* | (2006.01) |
| *F28D 7/16* | (2006.01) |
| *F28F 1/24* | (2006.01) |
| *H05K 7/20* | (2006.01) |
| *F24F 11/30* | (2018.01) |
| *F24F 11/70* | (2018.01) |
| *F24F 13/22* | (2006.01) |
| *F28D 20/00* | (2006.01) |
| *F28D 20/02* | (2006.01) |
| *F24F 110/10* | (2018.01) |
| *F24F 110/20* | (2018.01) |

(52) U.S. Cl.
CPC ............. *F24F 5/0021* (2013.01); *F24F 7/08* (2013.01); *F24F 11/30* (2018.01); *F24F 11/70* (2018.01); *F24F 13/222* (2013.01); *F28D 7/16* (2013.01); *F28D 20/00* (2013.01); *F28D 20/02* (2013.01); *F28D 20/021* (2013.01); *F28F 1/24* (2013.01); *H05K 7/2059* (2013.01); *H05K 7/20145* (2013.01); *H05K 7/20618* (2013.01); *H05K 7/20745* (2013.01); *H05K 7/20836* (2013.01); *F24F 2110/10* (2018.01); *F24F 2110/20* (2018.01); *F24F 2221/54* (2013.01); *Y02B 30/542* (2013.01); *Y02E 60/145* (2013.01); *Y02E 60/147* (2013.01)

(58) Field of Classification Search
CPC ........... H05K 7/20409–7/20418; H05K 7/20009–7/202; H05K 7/20827; H05K 7/2059; H05K 7/20618; H05K 7/20745; H01L 23/367–23/3677; H01L 23/473; H01L 23/46–23/467; F24F 11/30; F24F 11/70; F24F 5/0014; F24F 5/0021; F24F 7/08; F24F 3/14; F24F 13/222; F24F 2110/10; F24F 2110/20; F24F 2221/54; F28D 7/16; F28D 20/00; F28D 20/02; F28D 20/021; F28F 1/24; Y02B 30/542; Y02E 60/145; Y02E 60/147
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | |
|---|---|---|---|
| 9,723,762 B1 | 8/2017 | Ross et al. | |
| 2003/0014987 A1* | 1/2003 | Levenduski | F25B 39/04 62/185 |
| 2003/0041608 A1* | 3/2003 | Gonzalez-Cruz | F25B 27/007 62/235.1 |
| 2008/0034760 A1* | 2/2008 | Narayanamurthy | F24F 5/0017 62/59 |
| 2009/0173473 A1* | 7/2009 | Day | H05K 7/20754 165/67 |
| 2009/0211283 A1* | 8/2009 | Koh | F24F 5/0017 62/259.1 |
| 2010/0027216 A1 | 2/2010 | Matsushima et al. | |
| 2010/0043483 A1* | 2/2010 | Jacobi | F24F 5/0017 62/434 |
| 2010/0263830 A1 | 10/2010 | Noteboom et al. | |
| 2011/0154842 A1* | 6/2011 | Heydari | H05K 7/20836 62/259.2 |
| 2012/0063082 A1 | 3/2012 | Chang et al. | |
| 2012/0063087 A1 | 3/2012 | Wei | |
| 2012/0125573 A1* | 5/2012 | Rubenstein | F28D 15/00 165/104.33 |
| 2012/0134105 A1 | 5/2012 | Chang | |
| 2012/0327597 A1 | 12/2012 | Liu et al. | |
| 2013/0014522 A1* | 1/2013 | Lukasse | F25D 17/042 62/93 |
| 2013/0098597 A1* | 4/2013 | Fujimoto | H05K 7/20745 165/287 |
| 2013/0128455 A1 | 5/2013 | Koblenz et al. | |
| 2013/0201618 A1* | 8/2013 | Czamara | H05K 7/1497 361/679.5 |
| 2014/0060046 A1* | 3/2014 | Takahashi | F24S 60/00 60/641.8 |
| 2014/0211411 A1 | 7/2014 | Slaby et al. | |
| 2014/0233173 A1 | 8/2014 | Matsushita et al. | |
| 2014/0268548 A1* | 9/2014 | Rice | F25B 21/02 361/679.47 |
| 2014/0301027 A1* | 10/2014 | Noteboom | H05K 7/20736 361/679.5 |
| 2014/0301036 A1 | 10/2014 | Chainer et al. | |
| 2014/0340842 A1 | 11/2014 | Towner et al. | |
| 2014/0355203 A1 | 12/2014 | Kondo | |
| 2015/0036293 A1 | 2/2015 | Martini | |
| 2015/0156926 A1 | 6/2015 | Levesque | |
| 2015/0173252 A1* | 6/2015 | Zeighami | H05K 7/20781 340/606 |
| 2015/0195958 A1 | 7/2015 | Keisling et al. | |
| 2015/0237768 A1* | 8/2015 | Endo | H05K 7/20736 361/679.49 |
| 2015/0245540 A1 | 8/2015 | Ogawa et al. | |
| 2015/0250077 A1 | 9/2015 | Endo et al. | |
| 2015/0305196 A1* | 10/2015 | Saita | H05K 7/2079 361/692 |
| 2015/0319883 A1 | 11/2015 | Branton | |
| 2015/0334878 A1 | 11/2015 | Long et al. | |
| 2015/0342096 A1 | 11/2015 | Czamara et al. | |
| 2015/0359132 A1* | 12/2015 | Campbell | H05K 7/20236 361/700 |
| 2016/0021792 A1* | 1/2016 | Minegishi | F24F 11/30 361/679.47 |
| 2016/0187014 A1* | 6/2016 | Becker | F25B 7/00 62/99 |
| 2016/0211985 A1* | 7/2016 | Castillo | F24F 11/006 |
| 2016/0223455 A1* | 8/2016 | Minegishi | F24F 11/0008 |
| 2017/0016577 A1* | 1/2017 | Sinatov | F01K 3/12 |
| 2017/0071077 A1* | 3/2017 | Carlson | H05K 7/20827 |
| 2017/0146256 A1* | 5/2017 | Alexander | F24F 11/001 |
| 2017/0231118 A1* | 8/2017 | Cader | H05K 7/1497 |
| 2018/0014428 A1* | 1/2018 | Slessman | H05K 7/2079 |
| 2018/0195741 A1* | 7/2018 | Field | F24D 11/003 |

* cited by examiner

FREE COOLING IN HIGH HUMIDITY ENVIRONMENTS

This application is a continuation of U.S. patent application Ser. No. 15/070,908, filed Mar. 15, 2016, now U.S. Pat. No. 9,723,762, which is hereby incorporated by reference herein in its entirety.

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a racking system. Some known racking systems include 40 such rack-mounted components and such racking systems will therefore generate as much as 10 kilowatts of waste heat. Moreover, some known data centers include a plurality of such racking systems. Some known data centers include methods and apparatus that facilitate waste heat removal from a plurality of racking systems, typically by circulating air through one or more of the rack systems.

Many data centers rely on air conditioning systems with mechanical chillers to maintain the temperatures and other environmental conditions in their data centers within acceptable limits. The initial and ongoing costs of installing and operating these systems may add substantial cost and complexity to data center operations.

Some data centers rely on evaporative cooling (i.e. cooling utilizing the evaporation of a liquid) or free-cooling (i.e. cooling that does not use an evaporative cooler or a mechanical chiller) to maintain the temperatures and other environmental conditions in their data centers within acceptable limits. However, computers systems within data centers may not function properly if a relative humidity of air being used to cool the computer systems exceeds an upper threshold. Therefore, such data centers utilizing evaporative cooling and/or free cooling may be restricted to locations with weather conditions with mild temperatures and/or locations with low relative humidities.

Figure 1A:
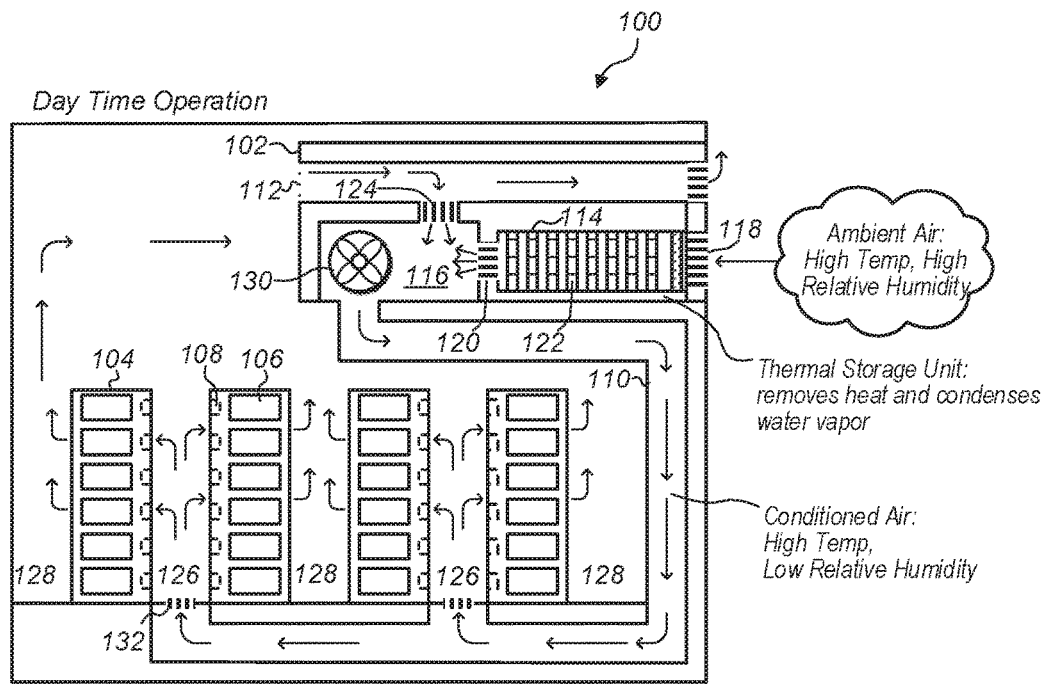
FIG. 1A illustrates daytime operation of a data center with an air handling system that includes a thermal storage unit, according to some embodiments.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Systems and methods for providing cooling to one or more thermal loads using an air handling system that includes a thermal storage unit are disclosed. According to one embodiment, a data center includes heat producing components, such as computer systems, electrical systems, networking equipment, etc., and an air handling system configured to provide temperature and humidity conditioned air to the heat producing components to cool the heat producing components. The air handling system includes a thermal storage unit and an air moving device configured to direct air from an external environment external to the data center across the thermal storage unit and toward the heat producing components. Under a given set of ambient air conditions for the air in the external environment, the thermal storage unit is configured to remove thermal energy from the air directed across the thermal storage unit as the air passes across the thermal storage unit. Under another set of ambient air conditions for the air in the external environment, the thermal storage unit is configured to release thermal energy previously removed from air passing across the thermal storage unit into the air directed across the thermal storage unit as the air passes across the thermal storage unit. Releasing thermal energy into air under the other set of ambient air conditions as the air passes across the thermal storage unit recharges the ability of the thermal storage unit to subsequently remove thermal energy from air under the given set of ambient air conditions. For example, a thermal storage unit may include a phase change material such as a paraffin wax, salt solution, an inorganic phase change material, or other suitable material with a high heat of fusion. The phase change material may melt (i.e. change from a solid phase to a liquid phase) when air passes across the thermal storage unit under a given set of ambient air conditions, such as day time ambient air conditions. The phase change material may subsequently solidify (and therefore recharge) when air passes across the thermal storage unit under another set of ambient air conditions, such as night time ambient air conditions. The melting of the phase change material may remove thermal energy from the air and cool the air as it passes across the thermal storage unit. The cooler air may be cooled below a dew point temperature of the air and therefore condense water vapor out of the air. Subsequently, the cooled air may be mixed with return air, thus slightly heating the mixture of air and lowering the relative humidity of the mixture of air. Also, solidifying the phase change material may result in thermal energy being released into the air and heating the air as the air passes across the thermal storage unit. The heating of the air may result in the relative humidity of the air being reduced. Under both the given and other ambient air conditions, air that has passed across the thermal storage unit and that has been mixed with return air may have a resulting lower relative humidity than ambient air. The lower relative humidity may be used to cool heat producing components, such as computer systems, in a data center.

According to one embodiment, an air handling system includes a thermal storage unit and an air moving device configured to direct air across the thermal storage unit. Under a given set of air conditions, the thermal storage unit is configured to remove thermal energy from air passing across the thermal storage unit, and under another set of air conditions, the thermal storage unit is configured to release the previously removed thermal energy into air passing across the thermal storage unit. The air handling system also includes a control system configured to control air flow through the air handling system such that an air flow including air that has passed across the thermal storage unit is maintained below a temperature threshold and a humidity threshold under the given set of air conditions and while the thermal storage unit is removing thermal energy from the air passing across the thermal storage unit. The control system is also configured to control air flow through the air handling system such that an air flow including air that has passed across the thermal storage unit is maintained below the temperature threshold and the humidity threshold under the other set of air conditions and while the thermal storage unit is releasing thermal energy into the air passing across the thermal storage unit.

According to one embodiment, a method includes directing air from an external environment across a thermal storage unit of an air handling system, wherein the thermal storage unit is configured to, under a given set of ambient air conditions for the air in the external environment, remove thermal energy from the air as the air passes across the thermal storage unit; and under another set of ambient air conditions for the air in the external environment, release thermal energy previously removed from air passing across the thermal storage unit into the air as the air passes across the thermal storage unit. The method includes the air handling system reducing the relative humidity of the air that has passed across the thermal storage unit and has been mixed with return air, under the given set of ambient air conditions and under the other set of ambient air conditions. The method also includes directing the air with the reduced relative humidity toward a thermal load to cool the thermal load.

As used herein, an "aisle" means a space next to one or more racks.

As used herein, "air moving device" includes any device, element, system, or combination thereof that can move air. Examples of air moving devices include fans and blowers.

As used herein, "ambient" refers to a condition of outside air at the location of a system or data center. An ambient temperature may be taken, for example, at or near an intake hood of an air handling system.

As used herein, a "cold aisle" means an aisle from which air can be drawn for use in removing heat from heat producing components of a system, such as heat producing components of a rack computing system.

As used herein, "computing" includes any operations that can be performed by a computer, such as computation, data storage, data retrieval, or communications.

As used herein, "computing device" includes any of various devices in which computing operations can be carried out, such as computer systems or components thereof. One example of a computing device is a rack-mounted server. As used herein, the term computing device is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. Some examples of computing devices include e-commerce servers, network devices, telecommunications equipment, medical equipment, electrical power management and control devices, and professional audio equipment (digital, analog, or combinations thereof). In various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, a "damper" includes any device or component that can be moved to control (e.g., increase or decrease) the flow of fluid through a plenum, duct or other passageway. Examples of dampers include plates, blades, panels, or discs, or any combination thereof. A damper may include multiple elements. For example, a damper may include a series of plates in parallel relation to one another that can be simultaneously rotated to close a duct. As used herein, to "adjust" a damper means to adjust one or more elements of the damper to achieve desired flow characteristics through the damper, such as open, closed, or partially open.

As used herein, "data center" includes any facility or portion of a facility in which computer operations are carried out. A data center may include servers dedicated to specific functions or serving multiple functions. Examples of computer operations include information processing, communications, simulations, and operational control.

As used herein, "evaporative cooling" means cooling of air by evaporation of a liquid.

As used herein, a "free cooling" includes a mode of operation in which an air handling system pulls air at least partially from an external source (such as air outside a facility) and forces the air to pass through electronic equipment without active chilling in the air-handling system (e.g., cooling in a facility that does not include a chiller or an evaporative cooler or cooling where fluid flow through chiller coils in a cooling system is shut off by closing a flow control valve or liquid is not supplied to an evaporative cooler in the cooling system).

As used herein, a "hot aisle" means an aisle into which heated air can be discharged for use in removing heat from a system, such as a rack computing system.

As used herein, "mechanical cooling" means cooling of air by a process that involves doing mechanical work on at least one fluid, such as occurs in vapor-compression refrigeration systems.

As used herein, "rack computing systems" means a computing system that includes one or more computing devices mounted in a rack.

As used herein, "room" means a room or a space of a building. As used herein, "computer room" means a room of a building in which computing devices, such as rack-mounted servers, are operated.

As used herein, "relative humidity" means an amount of moisture held in air relative to a total amount of moisture the air can hold at a specific temperature. For example, a relative humidity of air may range from 0 for dry air to 1 for saturated air (i.e. air that cannot hold additional water vapor).

As used herein, a "space" means a space, area or volume.

Some data centers use mechanical cooling systems to cool heat producing components, such as computers systems in the data centers. However, such mechanical cooling systems may consume considerable amounts of energy to cool the data centers, thus resulting in high operating costs and impacting the environment by way of pollution resulting from generation of the energy consumed by the mechanical cooling systems.

Some data centers, may utilize evaporative cooling systems to cool heat producing components, such as computers systems in the data centers. However, evaporative cooling systems may consume considerable amounts of water, thus increasing operating costs and consuming scarce resources. Also, heat producing components, such as computer systems in data centers may not function properly when a relative humidity of air being used to cool the heat producing components exceeds an upper limit. Thus, in locations with climates that have high relative humidities, evaporative cooling systems may not be a viable option for cooling heat producing components in data centers in these locations. Also, due to a limited capacity of air in such locations with high relative humidities to absorb additional water vapor, evaporative cooling systems may not provide sufficient heat removal to cool heat producing components of data centers in such locations. For example, in a location with a high relative humidity, the capacity of air being used in an evaporative cooling system to absorb additional water vapor and therefore evaporate and cool an air stream flowing through the evaporative cooling system may remove less thermal energy than an amount of thermal energy to be removed from heat producing components in the data center cooled by the evaporative cooling system. As another example, if high relative humidity air is used to cool heat producing components in a data center, such as computer systems, the use of high relative humidity air may result in water vapor condensing into liquid water within computer systems. This may cause corrosion, computer failures, and other damage to the computer systems. Also, even if water vapor in high relative humidity air does not condense into liquid water, the use of high relative humidity air to cool computer systems may result in other or similar damage to the computer systems.

Some data centers may use free-cooling to cool heat producing components, such as computer systems in the data centers. However, in locations with climates that have high relative humidities, free-cooling may also not be a viable option for cooling heat producing components in data centers in these locations due to relative humidity constraints on air used to cool heat producing components, such as computer systems, of the data centers.

However, a thermal storage unit may be used in an air handling system of a data center located in a location in a high relative humidity and/or high temperature environment to cool heat producing components of the data center by reducing a relative humidity of air used in the air handling system. In some embodiments, a thermal storage unit may remove thermal energy from air used to cool a data center under a given set of ambient air conditions, such as daytime ambient air conditions, and release thermal energy previously removed from air used to cool the data center into air being used to cool the data center under another set of ambient air conditions, such as night time ambient air conditions. The cooling of air under the given set of ambient air conditions (e.g. daytime conditions) in an air handling system may reduce the relative humidity of the air by removing water vapor from the air via condensation and subsequently heating the air above a new dew point temperature of the air that has been lowered due to the removal of the condensation from the air. The heating of the air under the other set of ambient air conditions (e.g. night time conditions) may reduce the relative humidity of the air by heating the air away from a dew point temperature of the air. For example, a thermal storage unit may remove heat from air during the day and heat air at night by releasing the heat previously removed during the day into the night time air. During operation under daytime ambient air conditions, an air handling system that includes a thermal storage unit may cool incoming air from an external environment external to a data center below a dew point temperature for the daytime air, thus resulting in condensation of water vapor in the air. Condensed water vapor may be removed from the air as the air passes through the air handling system, thus reducing the dew point temperature of the air. Subsequently, the air may be heated above the new lower dew point temperature resulting in lower relative humidity air. Also, during operation under night time ambient air conditions, an air handling system that includes a thermal storage unit may heat incoming air from an external environment external to the data center with thermal energy stored in the thermal storage unit that was previously removed from air during daytime operation. Heating the air may result in reducing the relative humidity of the air by heating the air further away from its dew point temperature. Thus an air handling system that includes a thermal storage unit may reduce a relative humidity of ambient air used to cool a data center under a given set of ambient air conditions by condensing water vapor out of the air and subsequently heating the air and may reduce a relative humidity of ambient air used to cool a data center under another set of ambient air conditions by heating the air to reduce the relative humidity of the air.

In some embodiments, computer systems of a data center may operate at higher temperatures than conventional data center operating temperatures (e.g. above 30-35° C., whereas conventional data centers may operate at around 25° C.) provided a relative humidity of air being used to remove waste heat from the computer systems is maintained below an upper relative humidity threshold. For example, in some embodiments, data centers may operate at temperatures similar to or above ambient day time temperatures in a particular location where the data center is located as long as a relative humidity of air being used to cool the computer systems in the data center does not surpass an upper relative humidity threshold.

In some data center locations, an ambient day time temperature may be higher than an ambient night time temperature. An air handling system of a data center with a thermal storage unit may take advantage of differences in temperature between daytime ambient air conditions and night time ambient air conditions by cooling air during the day to condense water vapor out of the air and subsequently heating the air with return air to lower the relative humidity of the air during the day and then using energy removed from the air during the day to heat cooler night time air to lower the relative humidity of the night time air without heating the night time air above an upper temperature limit that is comparable to daytime operating temperatures. Thus an air handling system with a thermal storage unit may provide conditioned air to cool heat producing components in a data center while maintaining the temperature and relative humidity of the air below a temperature threshold and a relative humidity threshold during both daytime and night time operation despite temperature and humidity fluctuations at the particular data center location from day to night. Moreover, an air handling system with a thermal storage unit may reduce a relative humidity of air used to cool heat producing components below a relative humidity threshold at a data center in a location with a high humidity and/or high temperature environment, wherein the relative humidity threshold is a lower relative humidity than both a relative humidity of air external to the data center under daytime ambient air conditions and lower than a relative humidity of air external to the data center under night time ambient air conditions.

In some embodiments, the temperature threshold and the relative humidity threshold may be determined based on acceptable operating temperatures and humidity levels for computer systems that are cooled by the air handling system. In some embodiments, the temperature threshold may be comparable to an average ambient daytime temperature in the data center location.

Figure 1B:
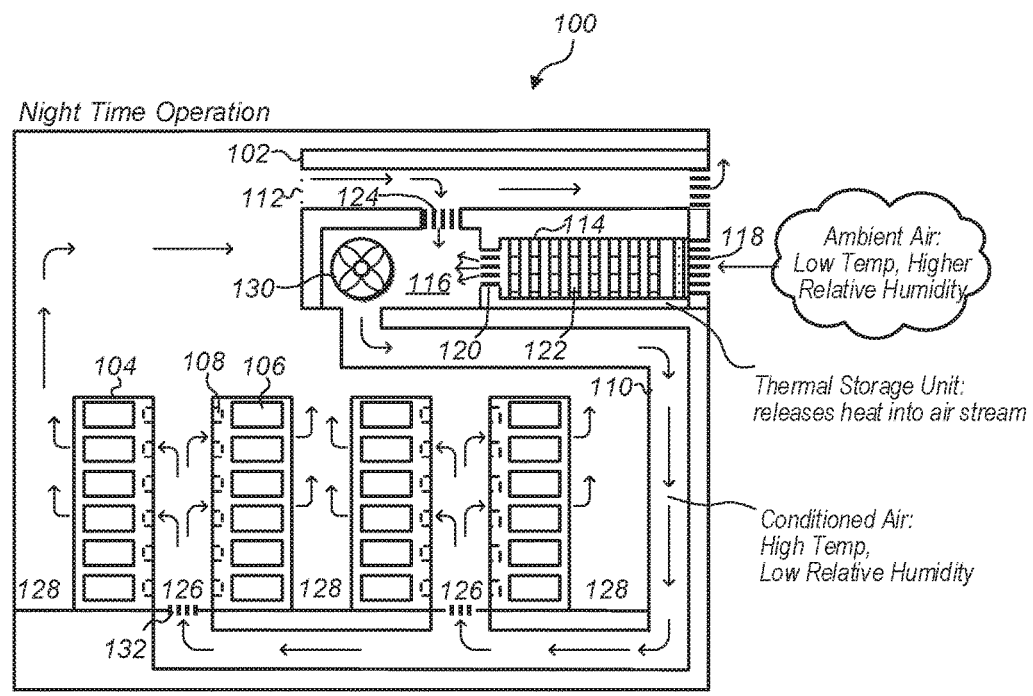
FIG. 1B illustrates night time operation of a data center with an air handling system that includes a thermal storage unit, according to some embodiments.

FIG. 1A illustrates daytime operation of a data center with an air handling system that includes a thermal storage unit and FIG. 1B illustrates night time operation of a data center with an air handling system that includes a thermal storage unit, according to some embodiments.

In some embodiments, a data center, such as data center 100, includes an air handling system, such as air handling system 102, and racks of computing devices, such as racks 104 that include computing devices 106 and sensors 108. An air handling system, such as air handling system 102, may direct cooling air towards thermal loads, such as computing devices 106 in racks 104, via a supply duct, such as supply duct 110. An air moving device, such as fan 130, may draw air from an external environment into an air handling system and direct air from an air handing system, such as air handling system 102, to one or more thermal loads to be cooled by the air handling system, such as computing devices 106 in racks 104. An air handling system, such as air handling system 102, may also receive return air that has passed over heat producing components, such as computing devices 106, via a return air duct, such as return air duct 112.

In some embodiments, an air handling system, such as air handling system 102, includes a thermal storage unit, such as thermal storage unit 114, coupled, via a damper, such as damper 118, to an external environment that is external to a data center, such as an environment external to data center 100. A thermal storage unit of an air handling system, such as thermal storage unit 114, may also be coupled to a mixing plenum via another damper, such as mixing plenum 116 and damper 120. In some embodiments, a thermal storage unit, such as thermal storage unit 114, includes tubes, such as tubes 122, filled with a phase change material configured to, under a given set of ambient air conditions, remove thermal energy from air passing through the thermal storage unit as the air passes from an external environment toward a mixing plenum. As discussed in more detail below in regard to night time operations described in regard to FIG. 1B, in some embodiments the phase change material may also be configured to release thermal energy into air passing through the thermal storage unit as the air passes from the external environment toward the mixing plenum, under another set of ambient air conditions, e.g. night time ambient air conditions.

In some embodiments, an air handling system, such as air handling system 102, may also include a damper that couples a return air duct with a mixing plenum. For example, air handling system 102 includes damper 124 that couples return air duct 112 with mixing plenum 116. In some embodiments, dampers, such as dampers 120 and 124, in response to control signals from a control system, such as a control system 304 as depicted in air handling system 300 in FIG. 3, may adjust respective flowrates of return air from a return air duct, such as return air duct 112, and of fresh conditioned air from the external environment that has passed across a thermal storage unit, such as air that has passed across thermal storage unit 114, into a mixing plenum, such as mixing plenum 116. For example, in order to adjust a temperature or a relative humidity of air in a mixing plenum, such as mixing plenum 116, a control system may cause a damper, such as one of dampers 120 or 124, to further open or close to adjust the amounts of air flowing into the mixing plenum, such as mixing plenum 116, from a return air duct, such as return air duct 112, or from a thermal storage unit, such as thermal storage unit 114.

In some embodiments, during daytime operation, air from an external environment external to a data center may be at a high temperature and a high relative humidity, whereas during night time operation, air from an external environment external to the data center may be at a lower temperature than the daytime air, but may have a higher relative humidity than the daytime air. For simplicity of illustration, ambient air conditions in an external environment external to data center 100 are described in terms of daytime ambient air conditions and night time ambient air conditions. However, it should be understood that an air handling system with a thermal storage unit may operate continuously between daytime ambient air conditions and night time ambient air conditions. For example, an air handling system may transition between day time operation and night time operation to maintain air supplied to cool heat producing components in a data center below a temperature threshold and a relative humidity threshold.

During night time operations, such as illustrated in FIG. 1B, ambient air drawn into an air handling system may pass through a thermal storage unit of the air handling system and be heated by thermal energy released from the thermal storage unit into the air as the air passes across the thermal storage unit. Heating the air may reduce the relative humidity of the air by increasing the temperature of the air away from its dew point temperature. The thermal energy released into the air may be thermal energy previously removed from air that passed through the thermal storage unit during daytime operations.

During daytime and night time operations, an air handling system may provide low relative humidity air for use in removing waste heat from heat producing components in a data center. For example, an air handling system that includes a thermal storage unit may provide air at a temperature comparable to daytime ambient temperatures in the location of a data center during both daytime and night time operations. However, the air provided from the air handling system may have a lower relative humidity than relative humidities of ambient air in the location of the data center during night time operation and during day time operations. Warm, low relative humidity air may be directed into a supply duct, such as supply duct 110 and pass through vents, such as vents 132 into cold aisles of a data center, such as cold aisles 126 of data center 100. The warm low-relative humidity air may pass across heat producing components, such as computing devices 106 in racks 104 and enter into a hot aisle, such as hot aisles 128. Hot air, such as warm air that has been further heated by removing waste heat from heat producing components in a data center, may flow back to an air handling system with a thermal storage unit via a return duct, such as return air duct 112. In some embodiments, various methods may be used to convey warm, low relative humidity air from an air handling system to thermal loads to be cooled by the air. Also, various methods may be used to return hot air that has removed waste heat from thermal loads back to an air handling system that includes a thermal storage unit.

For example, in some embodiments, hot aisles, cold aisles, or both may include one or more barriers or containment structures that separate air in the hot aisles from other air in the data center and/or that separate air in the cold aisles from other air in the data center. In some embodiments, a return duct, such as return air duct 112 may be physically coupled to a hot aisle containment structure. In some embodiments, a supply duct such as supply duct 110 may be routed in a space below a floor of a computing room of a data center, as illustrated in FIGS. 1A and 1B. In some embodiments, a supply duct, such as supply duct 110 may be routed in an overhead space above rack computing devices such as computing devices 106 in racks 104. In some embodiments, a supply duct, such as supply duct 110 may be physically coupled to a cold aisle containment structure. In some embodiments, other arrangements of ducts and plenums may be used to convey air to and from an air handling system with a thermal storage unit, such as air handling system 102.

FIGS. 2A-2D illustrate example graphs showing temperatures and relative humidities of air passing through an air handling system that includes a thermal storage unit during daytime operations and during night time operations, according to some embodiments. As temperatures and relative humidities may vary from location to location, FIGS. 2A-2D should not be understood as describing any particular temperature or relative humidity, but instead are intended to illustrate relationships between temperature and relative humidity. FIGS. 2A-2D illustrate how temperature and relative humidity of air passing through an air handling system with a thermal storage unit may change as the air passes through the air handling system.

Figure 2A:
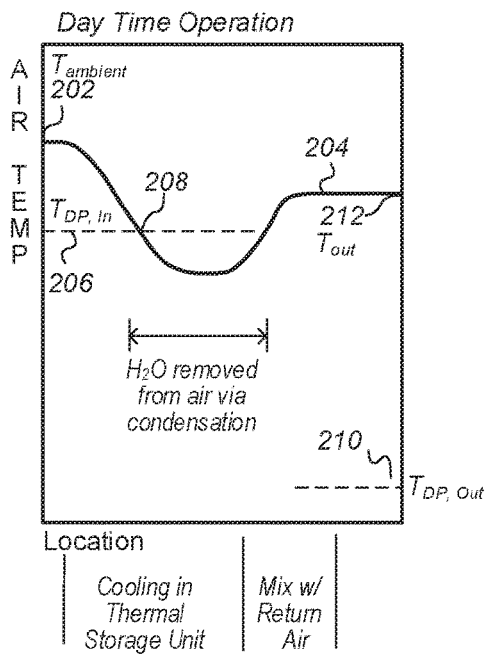
FIG. 2A illustrates an example graph of air temperatures of air passing through an air handling system that includes a thermal storage unit during daytime operation, according to some embodiments.

FIG. 2A illustrates an example graph of air temperatures of air passing through an air handling system that includes a thermal storage unit during daytime operation, according to some embodiments. Air from an external environment enters the air handling system at an ambient air temperature 202 of the external environment and with a relative humidity that corresponds with the dew point temperature 206 of the external environment. Line 204 illustrates how the air temperature of the air changes as the air passes through the air handling system that includes the thermal storage unit. Shortly after entering the air handling system, the air passes across a thermal storage unit that cools the air. For example, a thermal storage unit may include a phase change material that changes phases (e.g. melts from a solid to a liquid) as the air passes across the thermal storage unit, thus cooling the air. At 208, the air may be cooled slightly below the dew point temperature of the external environment. The cooling of the air below the dew point temperature of the external environment results in water vapor suspended in the air condensing into liquid water and falling out of the air. Because water vapor is removed from the air, the air, after passing through the thermal storage unit and having water vapor removed, may have a resulting lower dew point temperature than the dew point of the ambient air in the external environment, for example dew point temperature 210 is lower than dew point temperature 206. After passing across a thermal storage unit, the air with the lower dew point may further be heated by mixing the air with return air in a mixing plenum of an air handling system, such as mixing plenum 116 described in FIGS. 1A-1B. Heating the air by mixing the air with return air may further lower the relative humidity of the air. Air that has been mixed with return air may then be directed to one or more thermal loads to cool the thermal loads. The air leaving the air handling system and being directed to the thermal loads may have a temperature, such as outlet temperature 212 that is the same or slightly less than the temperature in the ambient environment, such as air temperature 202.

Figure 2C:
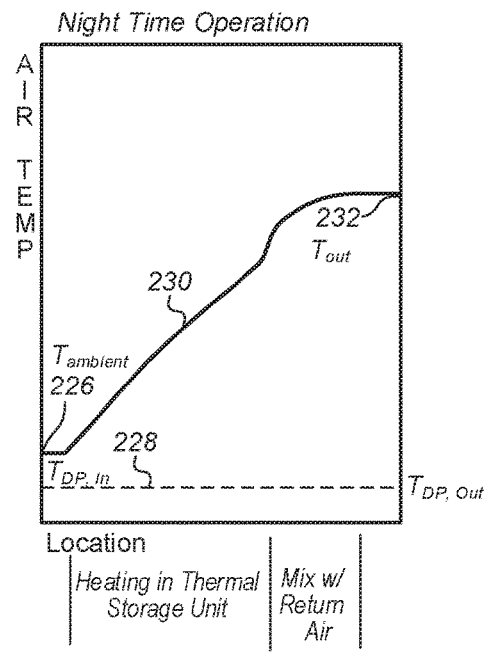
FIG. 2C illustrates an example graph of air temperatures of air passing through an air handling system that includes a thermal storage unit during night time operation, according to some embodiments.
Figure 2B:
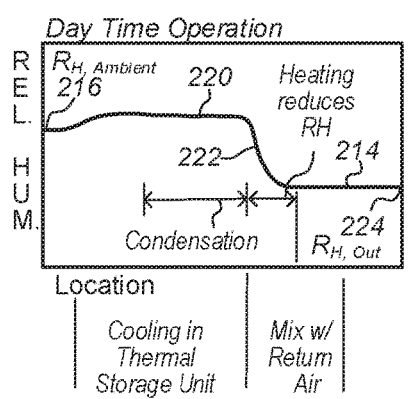
FIG. 2B illustrates an example graph of relative humidities of air passing through an air handling system that includes a thermal storage unit during daytime operation, according to some embodiments.

FIG. 2B illustrates an example graph of relative humidities of air passing through an air handling system that includes a thermal storage unit during daytime operation, according to some embodiments. Line 214 of FIG. 2B illustrates the relative humidities that corresponds with the temperatures illustrated by line 204 in FIG. 2A for air passing through an air handling system with a thermal storage unit during day time operating conditions. Air in the external environment external to the data center may have an ambient relative humidity, such as relative humidity 216, upon entering the air handling system. Initially as air entering the air handling system is cooled in the thermal storage unit, the relative humidity of the air may increase. However, as the air is cooled below its dew point, for example at 220, the air may become saturated and water vapor may be removed from the air as condensation. At 222, the air is further mixed with return air. The return air may heat the air that has passed across the thermal storage unit and may lower the relative humidity of the air. Air that has been mixed with return air may then be directed to one or more thermal loads to cool the thermal loads. The air leaving the air handling system and being directed to the thermal loads may have a relative humidity, such as relative humidity 224 that is lower than the relative humidity of the air in the ambient environment, such as the air in the external environment at relative humidity 216.

FIG. 2C illustrates an example graph of air temperatures of air passing through an air handling system that includes a thermal storage unit during night time operation, according to some embodiments. Air from an external environment enters the air handling system at an ambient air temperature 226 of the external environment and with a relative humidity that corresponds with the dew point temperature 228 of the external environment. Line 230 illustrates how the air temperature of the air changes as the air passes through the air handling system that includes the thermal storage unit. Shortly after entering the air handling system, the air passes across a thermal storage unit that heats the air. For example, a thermal storage unit may include a phase change material that changes phases (e.g. solidifies from a liquid to a solid) as the air passes across the thermal storage unit, thus releasing thermal energy into the air and heating the air. The heating of the air may reduce the relative humidity of the air by increasing the capacity of the air to hold water vapor in the air. After passing across a thermal storage unit, the air with the lower relative humidity may further be heated by mixing the air with heated return air in a mixing plenum of an air handling system, such as mixing plenum 116 described in FIGS. 1A-1B. Further heating the air by mixing the air with return air may further lower the relative humidity of the air. Air that has been mixed with return air may then be directed to one or more thermal loads to cool the thermal loads. The air leaving the air handling system and being directed to the thermal loads may have a temperature, such as outlet temperature 232 that is similar or slightly less than the temperature in the ambient environment during the day time operation of the air handling system, such as air temperature 202.

Figure 2D:
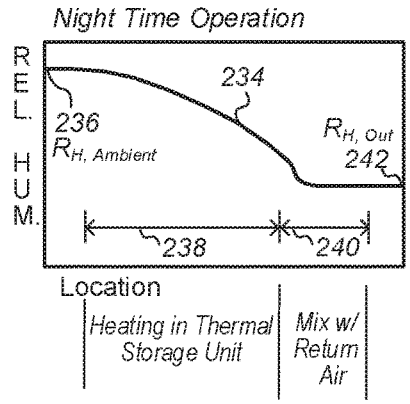
FIG. 2D illustrates an example graph of relative humidities of air passing through an air handling system that includes a thermal storage unit during night time operation, according to some embodiments.

FIG. 2D illustrates an example graph of relative humidities of air passing through an air handling system that includes a thermal storage unit during night time operation, according to some embodiments. Line 234 of FIG. 2D illustrates the relative humidity that corresponds with the temperatures illustrated by line 230 in FIG. 2C for air passing through an air handling system with a thermal storage unit during night time operating conditions. Air in the external environment external to the data center may have an ambient relative humidity, such as relative humidity 236, upon entering the air handling system. The air may be heated by thermal energy released from a thermal storage unit as the air passes across the thermal storage unit and the relative humidity of the air may accordingly be lowered. For example, at 238 the air is heated as it passes through the thermal storage unit. At 240, the air is further mixed with return air. The return air may further heat the air that has passed across the thermal storage unit and may further lower the relative humidity of the air. Air that has been mixed with return air may then be directed to one or more thermal loads to cool the thermal loads. The air leaving the air handling system and being directed to the thermal loads may have a relative humidity, such as relative humidity 242 that is lower than the relative humidity of the air in the ambient environment, such as the air in the external environment at relative humidity 236.

In some embodiments, air that has passed through an air handling system with a thermal storage unit may have a lower relative humidity than air in the location of the air handling system during night time operations and during daytime operations. For example, each of relative humidities 224 and 242 may be lower than relative humidity 216 and lower than relative humidity 236.

Figure 3:
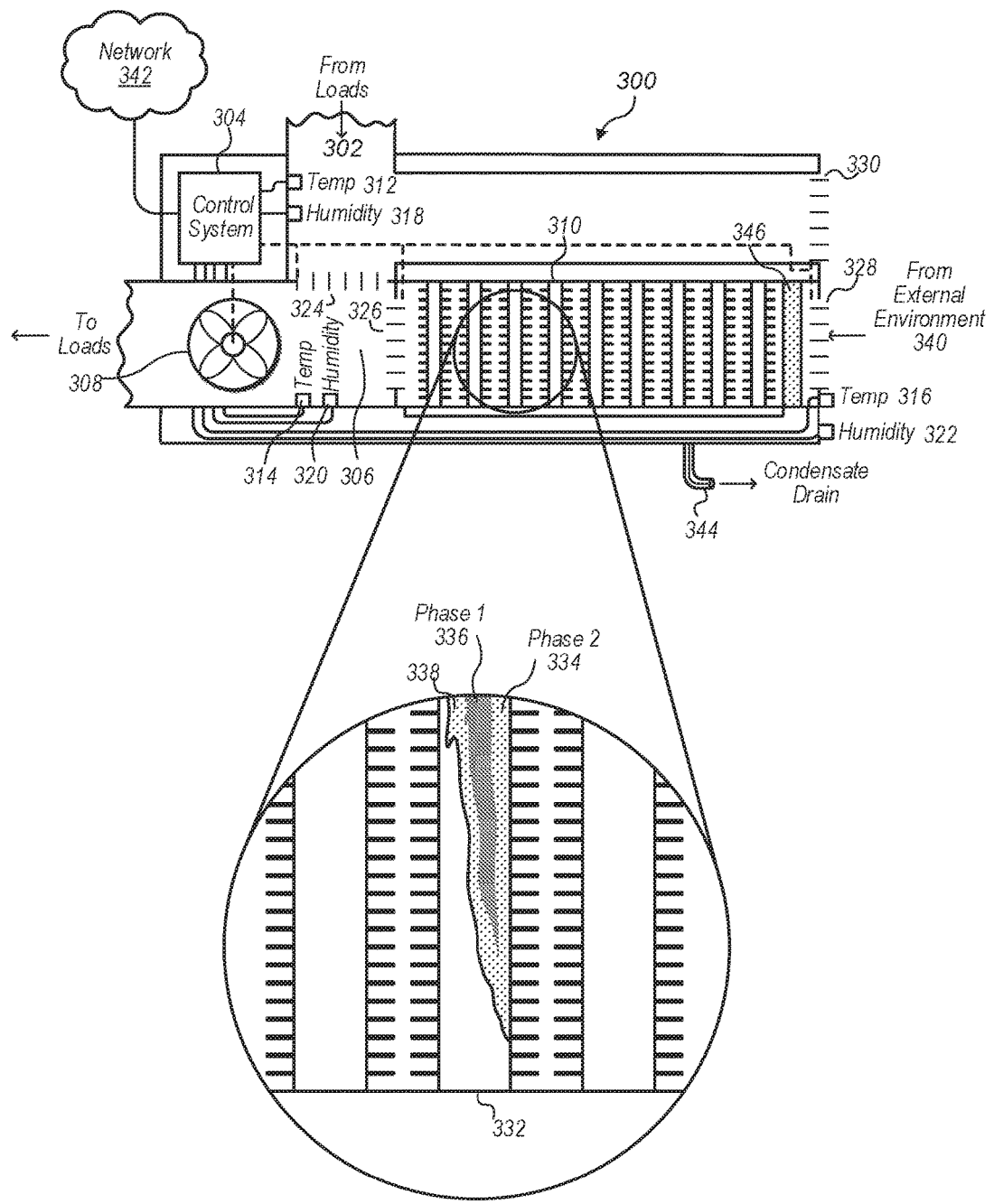
FIG. 3 illustrates an air handling system that includes a thermal storage unit, according to some embodiments.

FIG. 3 illustrates an air handling system that includes a thermal storage unit, according to some embodiments. An air handling system, such as air handling system 300 illustrated in FIG. 3 may include a thermal storage unit, such as thermal storage unit 310, that is coupled to an external environment external to a data center. An air handling system, such as air handling system 300, may also include an air moving device such as air moving device 308. An air moving device may cause air from an external environment to be drawn into an air handling system, such as air handling system 300, and to be directed across a thermal storage unit, such as thermal storage unit 310.

In some embodiments, a thermal storage unit of an air handling system, such as thermal storage unit 310 may include tubes that include a phase change material located in the tubes. For example, FIG. 3 illustrates a cutaway view of tube 332 filled with phase change material 338. Phase change material 338 may be any suitable material that changes phases over a temperature range of ambient air at a particular location where the air handling system is to be used, such as a material that solidifies under night time ambient air conditions and melts under daytime ambient air conditions. For example, phase change material 338 may be a paraffin wax, a salt solution, an inorganic phase change material, or some other suitable phase change material.

As can be seen in FIG. 3, during operation of an air handling system, a portion of a phase change material in a thermal storage unit may be in one phase while another portion of a phase change material in the thermal storage unit is in another phase. For example, portion 334 of phase change material 338 is in a second phase (e.g. liquid phase) and another portion 336 of phase change material 338 is in a first phase (e.g. solid phase). During day time operation of an air handling system as air passes across a thermal storage unit of the air handling system, such as thermal storage unit 310, a phase change material of the thermal storage unit, such as phase change material 338, may remove thermal energy from the air passing across the thermal storage unit. The thermal energy removed from the air passing across the thermal storage unit may cause a portion of the phase change material in the thermal storage unit to change phases. For example, thermal energy removed from air passing through thermal storage unit 310 may cause phase change material 338 to change phases from phase 1 to phase 2. During night time operation a reverse process may take place. Ambient air passing through a thermal storage unit, such as thermal storage unit 310, may be at a lower ambient air temperature than a phase change temperature of a phase change material, such as phase change material 338. As cooler ambient air passes across a thermal storage unit of an air handling device, the cooler ambient air may absorb heat released out of the phase change material causing the phase change material to change phases. For example, as cooler night time ambient air passes across thermal storage unit 310, phase change material 338 may change back from phase 2 to phase 1 (e.g. the phase change material may solidify or change from a liquid to a solid).

In some embodiments, an air moving device, such as air moving device 308 may draw air into an air handling system, such as air handling system 300, from a return duct, such as return duct 302, and from an external environment external to a facility in which the air handling system is installed, such as external environment 340. The air drawn into the air handling system may pass across a thermal storage unit of the air handling system. For example, air drawn into air handling system 300 from external environment 340 may pass across thermal storage unit 310. Under a given set of ambient air conditions, a thermal storage unit, such as thermal storage unit 310, may cool air drawn into an air handling system, such as air handling system 300, from an external environment, such as external environment 340. As the air is cooled in the thermal storage unit, water vapor in the air may condense in the thermal storage unit and be removed from the air flow. For example, condensed water vapor may be removed from air from external environment 340 as the air passes across thermal storage unit 310. Condensed water vapor may be drained from a thermal storage unit via a condensate drain, such as condensate drain 344. Under another set of ambient air conditions, a thermal storage unit, such as thermal storage unit 310, may heat air drawn into an air handling system, such as air handling system 300, from an external environment, such as external environment 340. Heating the air in the thermal storage unit may lower the relative humidity of the air.

Air that has passed across a thermal storage unit may be mixed with return air that has removed waste heat from a thermal load cooled by the air handling system. Mixing the air leaving a thermal storage unit with return air may lower the relative humidity of the resulting mixed air and slightly heat the resulting mixed air to a temperature greater than the temperature of the air exiting the thermal storage unit. For example, return air from return air duct 302 may mix with air that has passed across thermal storage unit 310 in mixing plenum 306.

In some embodiments, an air handling system, such as air handling system 300, may include a control system and dampers configured to adjust air flow into a mixing plenum from a return air source and a fresh air source that is conditioned by a thermal storage unit. For example, air handing system 300 includes control system 304 and dampers 324, 326, 328, and 330. In some embodiments an air handling system, such as air handling system 300, may further include temperature sensors and humidity sensors. For example, air handling system 300 includes temperature sensors 312, 314, and 316 and humidity sensors 318, 320, and 322. A control system of an air handling system, such as control system 304, may receive condition information from temperature sensors and humidity sensors, such as temperature sensors 312, 314, and 316 and humidity sensors 318, 320, and 322. A control system, such as control system 304 may also receive condition information from computing devices in a data center cooled by an air handling system, via a network, such as network 342. In some embodiments, a control system, such as control system 304, may also receive information about ambient weather conditions such as ambient temperatures and ambient relative humidities via a network, such as network 342. In some embodiments, weather conditions received by a control system via a network may be published weather reports, such as weather reports retrieved via the internet. A control system may determine damper positions and adjust damper positions based on temperature and humidity information from temperature and humidity sensors, based on condition information for rack computing devices received via a network connection, and based on ambient weather condition information received via a network connection. In some embodiments, a control system may determine damper positions based on more or less information. For example, in some embodiments less temperature and/or humidity sensors may provide temperature and humidity information to a control system or a control system may determine damper positions without a network connection.

In some embodiments, an air moving device of an air handling system, such as fan 308, may be a variable speed device and a control system, such as control system 304 may change an operating speed of an air moving device based on condition signals. For example, control system 304 may receive condition signals via network 342 indicting conditions in computing devices cooled by air handling system 300, such as temperature information and recirculation information. Recirculation information may be based on temperature differences between computing devices in a rack or in adjacent racks and may indicate that heated air (e.g. return air) is being recirculated into supply air. In response to receiving condition signals via network 342 indicating conditions in computing devices cooled by air handling system 300, control system 304 may increase or decrease a speed of fan 308 to adjust temperatures and recirculation at computing devices cooled by air handling system 300.

As another example, a control system may determine that air being directed toward thermal loads cooled by an air handling system exceeds a relative humidity set point for air to be supplied to the thermal loads. In order to prevent the air being supplied to the thermal loads from exceeding a relative humidity upper threshold for air to be supplied to the thermal loads, a control system, such as control system 304 may cause dampers 324 and 326 to adjust such that more return air from return air duct 302 is directed into mixing plenum 306 and/or less air that has passed across thermal storage unit 310 is directed into mixing plenum 306. These adjustments may cause the relative humidity of the air being directed toward the thermal loads to trend towards its set point. Also, a control system, such as control system 304, may further adjust an amount of air that flows across a thermal storage unit, such as thermal storage unit 310, by adjusting dampers 326 and 328. For example, a control system, such as control system 304 may adjust air flow across a thermal storage unit, such as thermal storage unit 310 to control a rate at which a phase change material in the thermal storage unit removes heat from the air passing across the thermal storage unit or releases heat into the air passing across the thermal storage unit. Continuing the example, in some embodiments, a control system may control air flow across a thermal storage unit such that a phase change material changes phases (i.e. melts or solidifies) at a particular rate such that the phase change material is not fully melted or solidified before ambient air conditions change from a given set of ambient air conditions to another set of ambient air conditions. For example, a control system may adjust air flow such that a phase change material lasts throughout the day without fully melting before night time.

In some embodiments, a control system, such as control system 304, may further adjust dampers 324 and 330 to control an amount of return air that is exhausted from a facility cooled by an air handling system, such as air handling system 300.

In some embodiments, an air handling system, such as air handling system 300 may include various types of air filters to remove particulates and chemicals from incoming air that is being drawn into a thermal storage unit of the air handling system. For example, air handling system 300 includes filter 346 between external environment 340 and thermal storage unit 310.

Any of the air handling systems described in FIGS. 1-2 and 4-9 could be an air handling system 300 as illustrated and described in FIG. 3.

Figure 4:
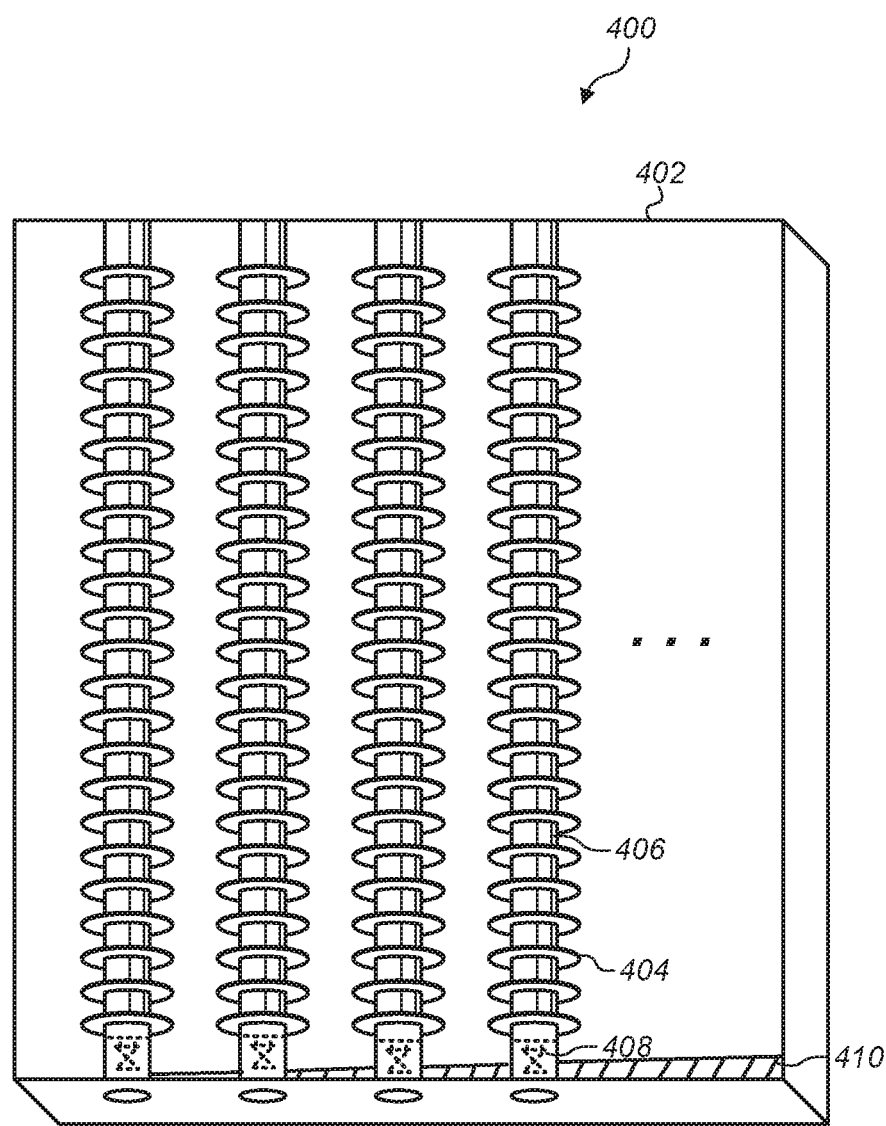
FIG. 4 illustrates tubes of a section of a thermal storage unit, according to some embodiments.

FIG. 4 illustrates tubes of a section of a thermal storage unit, according to some embodiments. In some embodiments, a thermal storage unit may include finned tubes filled with phase change material. A finned tube may have a greater surface area than a non-finned tube and therefore increase heat transfer from air flowing across the finned tubes. Also, finned tubes may be spaced such that the tubes do not restrict air flow of air passing across tubes of a thermal storage unit. For example, a pressure-drop caused by air flowing in a thermal storage unit across finned tubes may have a negligible impact on energy consumption of air moving devices used to direct air across the finned tube. In some embodiments, other heat exchanger arrangements may be used, for example, a phase change material may be located within adjacent plates of a exchanger and air may flow across the plates. In some embodiments, different heat exchanger arrangements may be used to hold a phase change material and transfer heat between the phase change material and air passing through a thermal storage unit.

For example, as illustrated in FIG. 4, tubes 406 of thermal storage unit section 400 include fins 404. Fins 404 may increase a surface area of tubes 406 and improve heat transfer from tubes 406. Also, tubes 406 may be positioned in thermal storage unit section 400 such that tubes 406 do not restrict air flow through thermal storage unit section 400. In some embodiments, tubes of a thermal storage unit may include more or less fins or larger or smaller fins than illustrated in FIG. 4. In some embodiments, a section of a thermal storage unit may include more or less tubes than illustrated in FIG. 4.

In some embodiments, various techniques may be used to cause air flowing across tubes of a thermal storage unit to exhibit turbulent flow to increase heat transfer. For example, in some embodiments, fins such as fins 404, may have a non-uniform geometry such as "V" shape, a wavy shape, or other suitable design that causes turbulent air flow. Also, in some embodiments, baffles may be used in a thermal storage unit to cause mixing of air passing through a thermal storage unit and therefore increase heat transfer in a thermal storage unit.

In some embodiments, tubes of a thermal storage unit may be mounted in a frame that can be individually removed from a thermal storage unit. For example, tubes 406 of thermal storage section 400 are mounted in frame 402. In some embodiments, a frame of a thermal storage unit section may include drain/fill mechanisms, such as valves, to allow a phase change material to be drained from one or more tubes and the one or more tubes filled with another phase change material. For example tubes 406 include valves 408 that may be used to drain and fill tube 406 with phase change materials.

In some embodiments, a phase change material may be selected based on seasons of the year. For example, a particular phase change material may have phase change properties that correspond with temperature variations during a particular season of the year and another phase change material may have phase change properties that correspond with another season of the year. In such embodiments, a drain/fill mechanism, such as valves 408, may be used to drain a phase change material that corresponds with a particular season of the year and to fill tubes of a thermal storage unit with a different phase change material that corresponds with another season of the year. In some embodiments, phase change materials may be selected based on additional or other criteria, such as changed operating conditions or based on an air handling system being moved from one location to another location with different ambient air conditions.

In some embodiments, a thermal storage unit may have a sloped bottom surface to direct condensate that is removed from air passing through the thermal storage unit to a condensate drain. For example, thermal storage unit section 400 includes sloped bottom surface 410.

Figure 5:
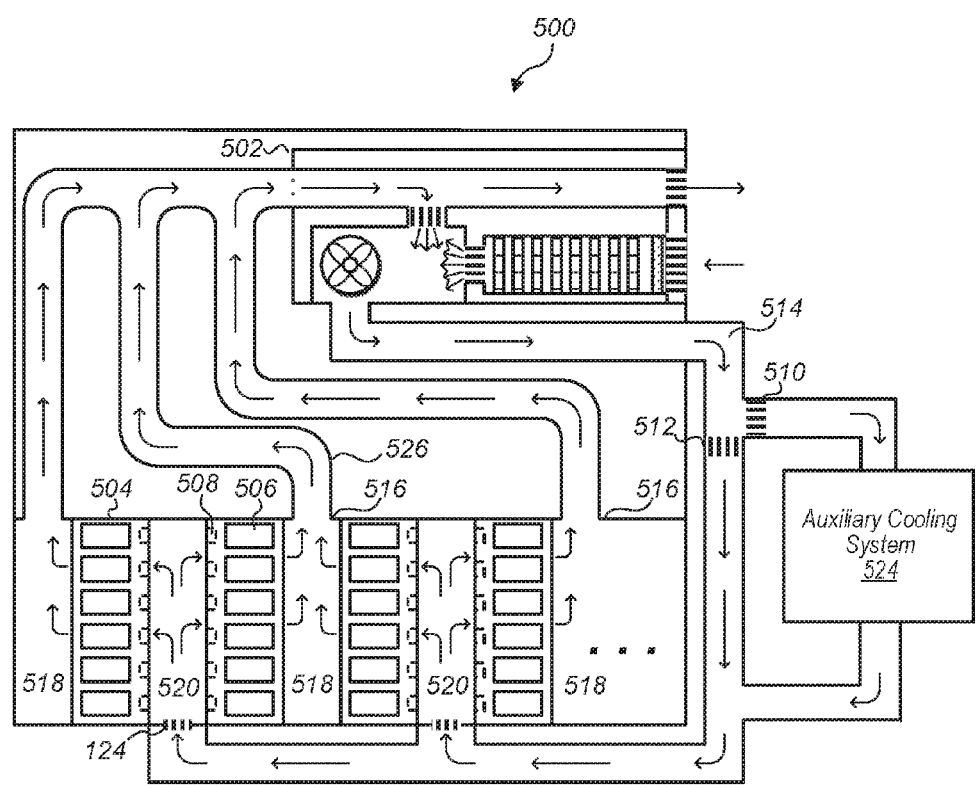
FIG. 5 illustrates a data center with an air handling system that includes a thermal storage unit and an auxiliary cooling system, according to some embodiments.

FIG. 5 illustrates a data center with an air handling system that includes a thermal storage unit and an auxiliary cooling system, according to some embodiments. In some embodiments, a data center may include, in addition to an air handling system that includes a thermal storage unit, an auxiliary cooling system. In some embodiments, an auxiliary cooling system may include a mechanical chiller, an evaporative cooler, or other auxiliary cooler that supplements an air handling system with a thermal storage unit. In some embodiments, a data center may be cooled by an air handling system without including in the data center an auxiliary cooling system. For example, in some embodiments, a data center and heat producing components in the data center may be cooled by an air handling system with a thermal storage unit without the data center including an auxiliary cooling system, such as a mechanical cooler, evaporative cooler or other cooler that is in addition to the air handling system.

For example, FIG. 5 illustrates data center 500 that includes air handling system 502. Air handling system 502 may be any of the air handling systems described in FIGS. 1-3. Data center 500 also includes auxiliary cooling system 524 and dampers 510 and 512. A control system, such as the control system 304 described in FIG. 3 may receive condition signals from sensors that monitor computing devices, such as sensors 508 mounted in racks 504 with computing devices 506. In some embodiments, sensors, such as, sensors 508 may be physical sensors, such as thermocouples, resistance temperature devices, humidity sensors, or other physical sensors. In some embodiments, sensors, such as sensors 508, may be virtual sensors that generate condition signals such as temperature condition signals, based on measuring another variable related to computing device performance, such as power consumption, processor usage, etc. A control system of an air handling system, based on received condition signals, may determine that additional cooling and/or relative humidity conditioning is needed to cool thermal loads in a data center in addition to cooling and relative humidity conditioning provided by an air handling system that includes a thermal storage unit. In response, the control system may cause damper 510 to divert a portion of air flowing through supply duct 514 through auxiliary cooling system 524. A controller may also cause damper 512 to partially close to divert a portion of air flowing through supply duct 514 to pass through auxiliary cooling system 524. Diverting a portion of air through an auxiliary cooling system may supplement cooling provided by an air handling system that includes a thermal storage unit to maintain air provided to cool computing devices in a data center, such as computing devices 506 in racks 504, below a temperature threshold. An auxiliary cooling system, such as auxiliary cooling system 524, may operate at a temperature below a dew point temperature of air leaving an air handling system, such as air handling system 502. Thus, air that passes through an auxiliary cooling system may further have water vapor removed from the air via condensation and exit the auxiliary cooling system with a lower dew point temperature than when entering the auxiliary cooling system. In this way, further cooling a portion of the air exiting an air handling system in an auxiliary cooling system does not lower the overall relative humidity of air being supplied to cool thermal loads below a relative humidity threshold of the air handling system.

In some embodiments, a data center may include hot aisle containment structures and cold aisle containment structures that separate air in hot aisles and air in cold aisles from other air in the data center. In data centers that run at high temperatures, recirculation of air from a hot aisle back to a cold aisle may reduce the effectiveness of an air handling system to remove waste heat from heat producing components in the data center and cause heat producing components in the data center, such as computing devices 506, to overheat. However, a hot aisle and/or cold aisle containment structure may prevent recirculation of heated exhaust air into a cold aisle by creating one or more barriers between cold aisles and hot aisles. For example, return ducts 526 are connected to hot aisle containment structures 516 to segregate air in hot aisles 518 from other air in data center 500. Also, supply duct 514 is coupled to cold aisles 520 and cold aisles 520 include cold aisle containment structures 522 to segregate air in cold aisles 520 from other air in data center 500.

Figure 6:
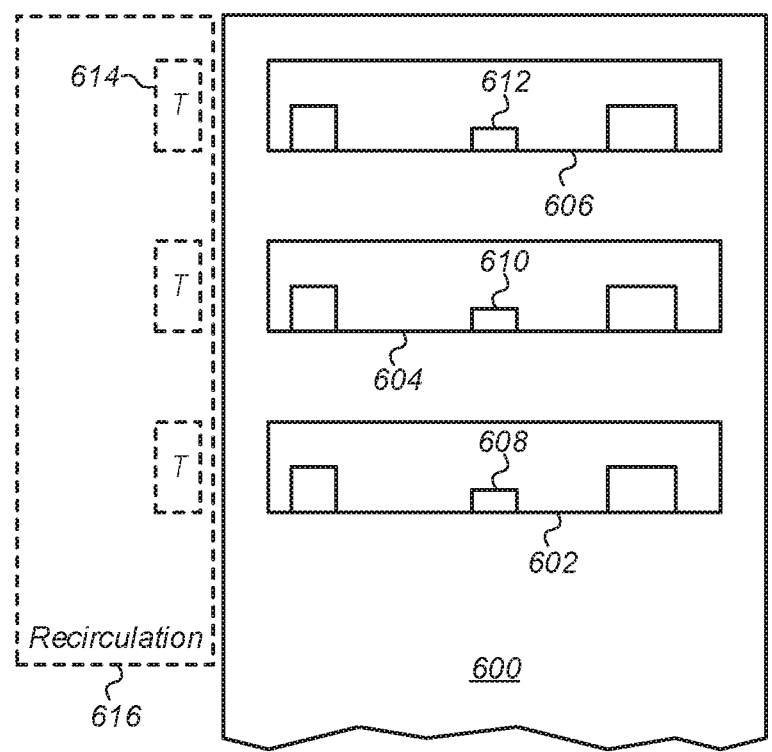
FIG. 6 illustrates computer systems mounted in a rack and virtual sensors that measure conditions related to the computer systems, according to some embodiments.

FIG. 6 illustrates computing devices mounted in a portion of a rack and virtual sensors that measure conditions related to the computing devices, according to some embodiments. Rack 600 includes rack mounted computing devices 602, 604, and 606. Rack computing devices include processors 608, 610, and 612. Also virtual temperature sensors 614 and virtual recirculation sensor 616 indicate conditions in rack mounted computing devices 602, 604, and 606. For example, virtual temperature sensors 614 determine an inlet temperature to rack computing devices 602, 604, and 606 based on a known relationship between workloads of processors 608, 610, and 612 and inlet air temperatures at inlets to rack mounted computing devices 602, 604, and 606. In some embodiments, other measured conditions within a rack mounted computing device, such as hard drive workload, power supply conditions, etc. may be used in a virtual sensor to determine an inlet temperature to a rack mounted computing device.

A virtual recirculation sensor may indicate an amount of air that is being recirculated through rack mounting computing devices. For example air exiting a rack mounted computing device that has picked up thermal energy when cooling heat producing components in a rack mounted computing device may be drawn back into an inlet of the same or a different rack mounted computing device as recirculated air. Often recirculation is caused by pressure imbalances between air inlets to rack mounted computing devices and air outlets from rack mounted computing devices. Also, openings between a cold aisle that supplies cooling air to rack mounted computing devices and a hot aisle that receives heated air from a rack mounted computing device may result in recirculation. A virtual recirculation sensor may compare variations in temperatures in rack computing devices, such as temperatures of virtual inlet temperature sensors to determine a measure of recirculation. In some embodiments, an amount of recirculation indicated by a virtual recirculation sensor may be based on a difference between the highest and lowest determined inlet temperatures for a given rack. In some embodiments, a control system may be configured to select an optimum or near optimum set of control parameters while satisfying one or more conditions such as an acceptable amount of recirculation that may be tolerated. In order to reduce recirculation, a control system may increase or decrease fan speeds of air handling devices controlled by the control system. Changing fan speeds may alter air pressure conditions in a data center room such that an amount of recirculation in rack mounted computing devices in the computer room is reduced. In embodiments, in which an air handling system operates in high temperature environments, only small amounts of recirculation may be tolerated in order for computing devices cooled by the air handling system to stay below a temperature threshold and not overheat.

Figure 7:
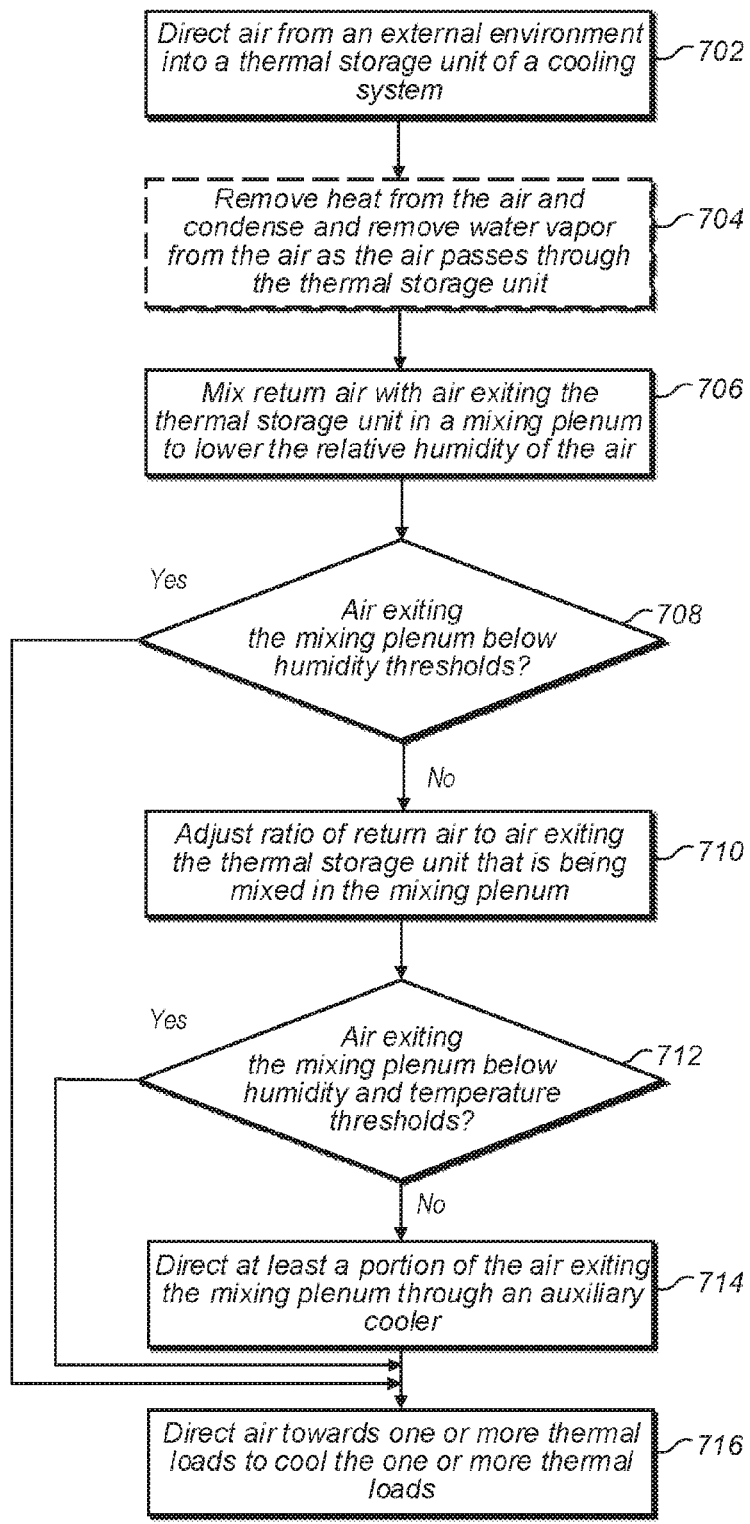
FIG. 7 illustrates a process of cooling a thermal load using an air handling system that includes a thermal storage unit during daytime conditions, according to some embodiments.

FIG. 7 illustrates a process of cooling a thermal load using an air handling system that includes a thermal storage unit during daytime conditions, according to some embodiments. At 702 air is directed into an air handling system that includes a thermal storage unit from an external environment. In some embodiments, an air handling device may draw air into a thermal storage unit of an air handling system from an ambient environment such as an outdoor environment outside a data center that includes the air handling system. During the daytime, ambient air conditions may be warmer than night time ambient air conditions and ambient day time air may have a lower relative humidity than ambient night time air.

At 704, heat is removed from the air drawn into the air handling system as the air passes across the thermal storage unit. Also, water vapor is removed from the air as the air passes across the thermal storage unit. The air may be cooled in the thermal storage unit below its dew point temperature. In FIG. 7, 704 is illustrated with a dashed line to indicate that removing heat in a thermal storage unit due to a phase change material changing phases, and water condensing in air are due to the physical properties of the phase change material and the physical properties of the ambient air and may not be positive actions performed by an air handling system.

At 706, air exiting the thermal storage unit is mixed in a mixing plenum with return air that has removed waste heat from thermal loads cooled by the air handling system. The air exiting the thermal storage unit may be at or near its dew point temperature. Also, the air exiting the thermal storage unit may have lost water vapor in the thermal storage unit via condensation. Thus the air exiting the thermal storage unit may have a lower dew point than ambient air external to a facility where the air handling system is located. The return air may be at a higher temperature than the air exiting the thermal storage unit, but may have a lower relative humidity. The return air may combine with the air exiting the thermal storage unit to heat the air exiting the thermal storage unit away from its dew point temperature. The resulting mix of return air and air exiting the thermal storage unit may have a lower relative humidity than ambient air in the external environment external to the facility where the air handling system is located.

At 708, a control system of an air handling system determines if air exiting the mixing plenum is below one or more relative humidity thresholds. If the air is below the one or more humidity thresholds, at 716 the air is directed toward one or more thermal loads to cool the thermal loads.

At 710, in response to determining the air exiting the mixing plenum is not below the one or more humidity thresholds, an amount of return air mixed with the air in the mixing plenum is adjusted to further lower the relative humidity of the air exiting the mixing plenum.

At 712, a control system determines if air exiting the mixing plenum is below one or more relative humidity thresholds and below one or more temperature thresholds. If the air is below the one or more temperature thresholds and the one or more humidity thresholds, at 716 the air is directed toward one or more thermal loads to cool the thermal loads.

At 714, in response to determining the air exiting the mixing plenum is not below the one or more humidity thresholds and the one or more temperature thresholds, at least a portion of the air is directed to an auxiliary cooling system to further reduce the humidity of the air and cool the air. In some embodiments, a data center does not include an auxiliary cooling system and 714 may be omitted.

At 716, air satisfying the one or more relative humidity thresholds and the one or more temperature thresholds is directed to one or more thermal loads cooled by the air handling system.

Figure 8:
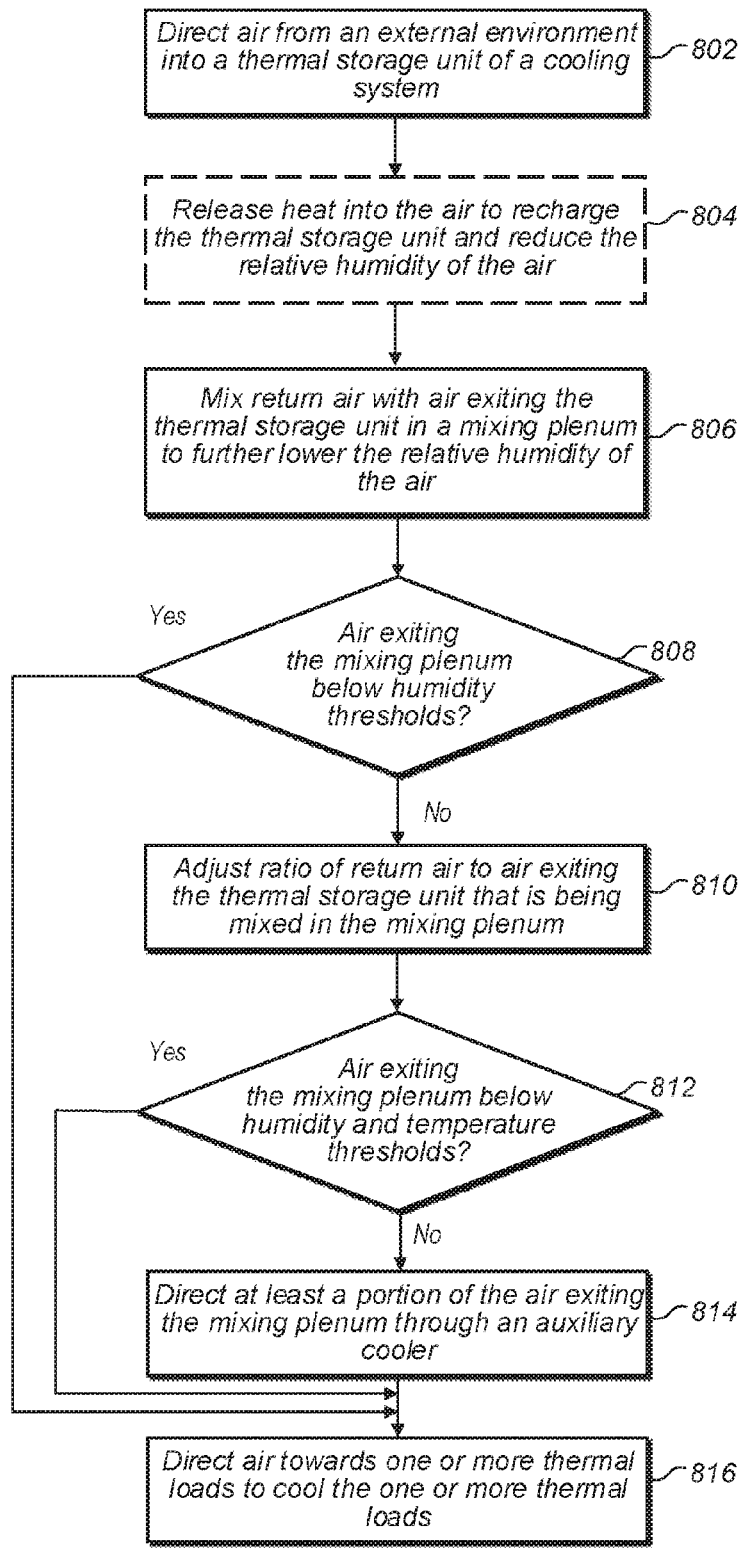
FIG. 8 illustrates a process of cooling a thermal load using an air handling system that includes a thermal storage unit during night time conditions, according to some embodiments.

FIG. 8 illustrates a process of cooling a thermal load using an air handling system that includes a thermal storage unit during night time conditions, according to some embodiments. At 802 air is directed into an air handling system, that includes a thermal storage unit, from an external environment. During the night time, ambient air conditions may be cooler than daytime ambient air conditions and ambient night time air may have a higher relative humidity than ambient day time air.

At 804, heat is released into the air drawn into the air handling system as the air passes across the thermal storage unit. Releasing thermal energy or heat into air as air passes across the thermal storage unit may lower a relative humidity of the air. In FIG. 8, 804 is illustrated with a dashed line to indicate that releasing heat from a thermal storage unit due to a phase change material changing phases, and lowering a relative humidity of air as the air is heated occur due to physical properties of the phase change material and physical properties of the ambient air and may not be positive actions performed by an air handling system.

At 806, air exiting the thermal storage unit is mixed in a mixing plenum with return air that has removed waste heat from thermal loads cooled by the air handling system. The return air may be at a higher temperature than the air exiting the thermal storage unit. The return air may combine with the air exiting the thermal storage unit to heat the air exiting the thermal storage unit further away from its dew point temperature. The resulting mix of return air and air exiting the thermal storage unit may have a lower relative humidity than ambient air in the external environment external to the facility where the air handling system is located.

At 808, a control system of an air handling system determines if air exiting the mixing plenum is below one or more relative humidity thresholds. If the air is below the one or more humidity thresholds, at 816 the air is directed toward one or more thermal loads to cool the thermal loads.

At 810, in response to determining the air exiting the mixing plenum is not below the one or more humidity thresholds, an amount of return air mixed with the air in the mixing plenum is adjusted to further lower the relative humidity of the air in the mixing plenum.

At 812, a control system determines if air exiting the mixing plenum is below one or more relative humidity thresholds and below one or more temperature thresholds. If the air is below the one or more temperature thresholds and the one or more humidity thresholds, at 816 the air is directed toward one or more thermal loads to cool the thermal loads.

At 814, in response to determining the air exiting the mixing plenum is not below the one or more relative humidity thresholds and the one or more temperature thresholds, at least a portion of the air is directed to an auxiliary cooling system to further reduce the humidity of the air and/or cool the air. In some embodiments, a data center does not include an auxiliary cooling system and 814 may be omitted.

At 816, air satisfying the one or more relative humidity thresholds and the one or more temperature thresholds is directed to one or more thermal loads cooled by the air handling system to cool the one or more thermal loads.

Figure 9:
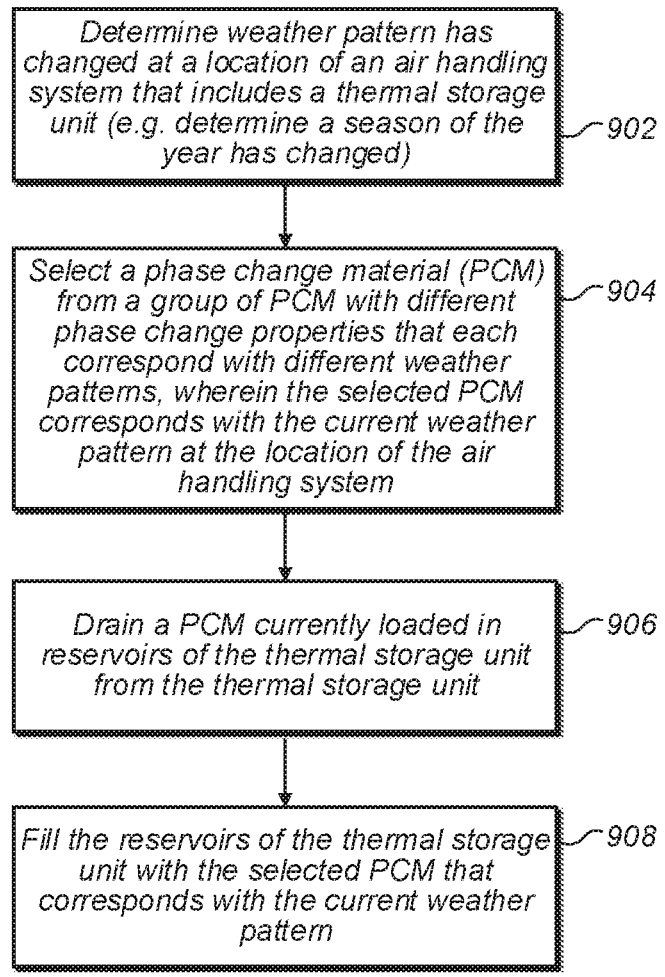
FIG. 9 illustrates a process of changing a phase change material used in a thermal storage unit of an air handling system, according to some embodiments.

FIG. 9 illustrates a process of changing a phase change material used in a thermal storage unit of an air handling system, according to some embodiments. At 902 it is determined that a weather pattern at a location of an air handling system has changed. For example, it may be determined that a season of the year has changed, for example the season of the year may have changed from summer to winter.

At 904, a phase change material is selected from a group of phase change materials with different phase change properties that each correspond with different weather patterns. The selected phase change material may correspond with the current weather pattern at the location of the air handling system. For example, a group of phase change materials may include phase change materials with phase change properties that correspond with summer weather patterns and winter weather patterns. During the summer, a summer phase change material may be selected and during winter, a winter phase change material may be selected.

At 906, a phase change material currently loaded in reservoirs, such as tubes, of a thermal storage unit is drained from the thermal storage unit.

At 908, the selected phase change material is loaded into the reservoirs of the thermal storage unit. For example, a thermal storage unit may include drain/fill mechanisms, such as valves, and a current PCM material may be drained from the thermal storage unit via the valves and reservoirs of the thermal storage unit, such as tubes, may be filled with the selected phase change material via the valves.

Figure 10:
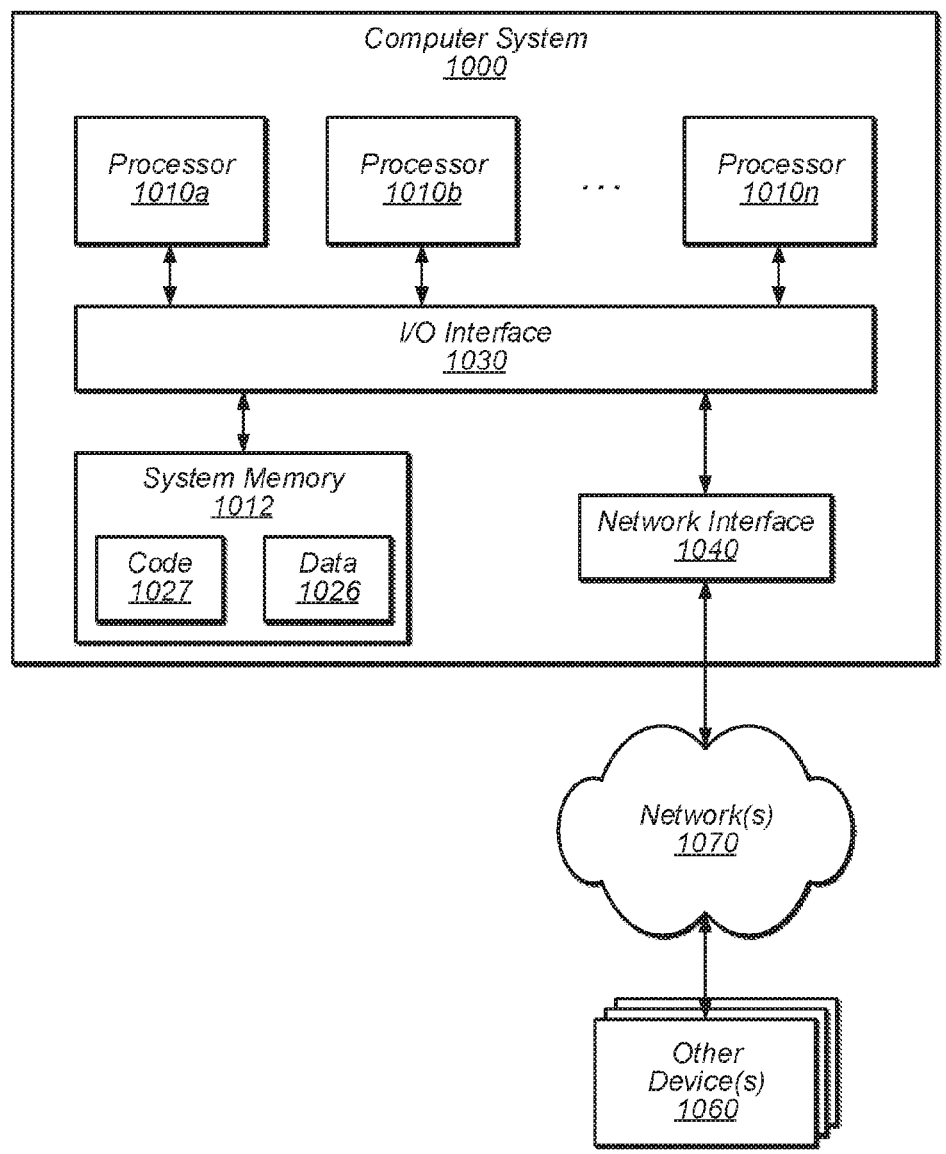
FIG. 10 illustrates a computer system that can be used in a service provider network and/or to at least partly implement a model based cooling control system, according to some embodiments.

FIG. 10 illustrates a computer system that can be used in a service provider network and/or to at least partly implement a model based cooling control system, according to some embodiments. In some embodiments, a computer that implements a portion or all of one or more of the technologies, including but not limited to the control system and the computing devices as described herein, may include a general-purpose computer system that includes or is configured to access one or more computer-accessible media, such as computer system 1000 illustrated in FIG. 10. In the illustrated embodiment, computer system 1000 includes one or more processors 1010 coupled to a system memory 1020 via an input/output (I/O) interface 1030. Computer system 1000 further includes a network interface 1040 coupled to I/O interface 1030.

In various embodiments, computer system 1000 may be a uniprocessor system including one processor 1010, or a multiprocessor system including several processors 1010 (e.g., two, four, eight, or another suitable number). Processors 1010 may be any suitable processors capable of executing instructions. For example, in various embodiments, processors 1010 may be general-purpose or embedded processors implementing any of a variety of instruction set architectures (ISAs), such as the x86, PowerPC, SPARC, or MIPS ISAs, or any other suitable ISA. In multiprocessor systems, each of processors 1010 may commonly, but not necessarily, implement the same ISA.

System memory 1020 may be configured to store instructions and data accessible by processor(s) 1010. In various embodiments, system memory 1020 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing one or more desired functions, such as those methods, techniques, and data described above for the control system, are stored within system memory 1020 as code 1025 and data 1026.

In one embodiment, I/O interface 1030 may be configured to coordinate I/O traffic between processor 1010, system memory 1020, and any peripheral devices in the device such as modular hardware acceleration devices coupled with a modular controller, including network interface 1040 or other peripheral interfaces. In some embodiments, I/O interface 1030 may perform any necessary protocol, timing or other data transformations to convert data signals from one component (e.g., system memory 1020) into a format suitable for use by another component (e.g., processor 1010). In some embodiments, I/O interface 1030 may include support for devices attached through various types of peripheral buses, such as a variant of the Peripheral Component Interconnect Express (PCIe) bus standard or the Universal Serial Bus (USB) standard, for example. In some embodiments, the function of I/O interface 1030 may be split into two or more separate components, such as a north bridge and a south bridge, for example. Also, in some embodiments some or all of the functionality of I/O interface 1030, such as an interface to system memory 1020, may be incorporated directly into processor 1010.

Network interface 1040 may be configured to allow data to be exchanged between computer system 1000 and other devices 1060 attached to a network or networks 1050, such as other computer systems or devices as illustrated in FIGS. 1 through 9, for example. In various embodiments, network interface 1040 may support communication via any suitable wired or wireless general data networks, such as types of Ethernet network, for example. Additionally, network interface 1040 may support communication via telecommunications/telephony networks such as analog voice networks or digital fiber communications networks, via storage area networks such as Fibre Channel SANs, or via any other suitable type of network and/or protocol.

In some embodiments, system memory 1020 may be one embodiment of a non-transitory computer-accessible medium configured to store program instructions and data for implementing a particular processing system that implements a control system as described above relative to FIGS. 1-9. In other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to computer system 1000 via I/O interface 1030. A non-transitory computer-accessible storage medium may also include any volatile or non-volatile media such as RAM (e.g. SDRAM, DDR SDRAM, RDRAM, SRAM, etc.), ROM, etc, that may be included in some embodiments of computer system 1000 as system memory 1020 or another type of memory. Further, a computer-accessible medium may include transmission media or signals such as electrical, electromagnetic, or digital signals, conveyed via a communication medium such as a network and/or a wireless link, such as may be implemented via network interface 1040.

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc.), as well as transmission media or signals such as electrical, electromagnetic, or digital signals, conveyed via a communication medium such as network and/or a wireless link.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An air handling system, comprising: a thermal storage unit, comprising a phase change material, configured to: condense, under a given set of air conditions, water vapor in air passing across the thermal storage unit to lower a relative humidity of the air passing across the thermal storage unit; an air moving device configured to direct the air across the thermal storage unit; and a control system configured to control air flow through the air handling system such that an air flow comprising the air that has passed across the thermal storage unit combines with a return air flow such that air of a combined air flow is maintained below a humidity threshold under the given set of air conditions.

2. The air handling system of claim 1, wherein the phase change material at least partially changes phases as the air passes across the thermal storage unit.

3. The air handling system of claim 1, wherein the thermal storage unit is further configured to: heat, under another set of air conditions, the air passing across the thermal storage unit to lower the relative humidity of the air passing across the thermal storage unit, wherein the control system is further configured to control the air flow through the air handling system such that the combined air flow comprising the air that has passed across the thermal storage unit is maintained below the humidity threshold under the another set of air conditions.

4. The air handling system of claim 1, wherein the air handling system further comprises: a mixing plenum coupled to the thermal storage unit; and a damper coupled between a return duct, from a thermal load cooled by the air handling system, and the mixing plenum; wherein the control system is further configured to control the damper to adjust an amount of return air of the return air flow that flows into the mixing plenum to maintain the air of the combined air flow under the humidity threshold under the given set of air conditions.

5. The air handling system of claim 4, wherein the air handling system further comprises: an additional damper at an external air inlet or at an external air exhaust of the air handling unit; wherein the control system is further configured to control the additional damper to adjust an amount of fresh air from an external environment that flows into the mixing plenum to maintain the air of the combined air flow under the humidity threshold under the given set of air conditions.

6. The air handling system of claim 4, wherein the air handling system further comprises: an additional damper configured to direct: a portion of the air of the air flow comprising the air that has passed across the thermal storage unit that is directed to the mixing plenum, a portion of the air of the return air flow that is directed to the mixing plenum, or a portion of the air of the combined air flow that is directed from the mixing plenum, to pass through an auxiliary cooling system; wherein the control system is further configured to adjust the additional damper to adjust: the portion of the air of the air flow comprising the air that has passed across the thermal storage unit, the portion of the air of the return air flow, or the portion of the air of the combined air flow, that is directed through the auxiliary cooling system.

7. The air handling system of claim 1, wherein the air handling system does not include a mechanical cooler and does not include an evaporative cooler.

8. An air handling system, comprising: a thermal storage unit, comprising a phase change material, configured to: heat, under a given set of air conditions, air passing across the thermal storage unit to lower a relative humidity of the air passing across the thermal storage unit under the given set of air conditions; an air moving device configured to direct the air across the thermal storage unit; and a control system configured to control air flow through the air handling system such that an air flow comprising the air that has passed across the thermal storage unit combines with a return air flow such that air of a combined air flow is maintained below a humidity threshold under the given set of air conditions.

9. The air handling system of claim 8, wherein the thermal storage unit is further configured to: condense, under another set of air conditions, water vapor in the air passing across the thermal storage unit to lower a relative humidity of the air passing across the thermal storage unit, wherein the control system is further configured to control the air flow through the air handling system such that the air of the combined air flow comprising the air that has passed across the thermal storage unit is maintained below the humidity threshold under the another set of air conditions.

10. The air handling system of claim 8, wherein the air handling system further comprises: a mixing plenum coupled to the thermal storage unit; and a damper coupled between a return duct, from a thermal load cooled by the air handling system, and the mixing plenum; wherein the control system is further configured to control the damper to adjust an amount of the air of the return air flow that flows into the mixing plenum to maintain the air of the combined air flow under the humidity threshold under the given set of air conditions.

11. The air handling system of claim 10, wherein the air of the return air flow is at a higher temperature than the air that has been heated by the thermal storage unit.

12. The air handling system of claim 10, wherein the air handling system further comprises: an additional damper at an external air inlet or at an external air exhaust of the air handling unit; wherein the control system is further configured to control the additional damper to adjust an amount of fresh air from an external environment that flows into the mixing plenum to maintain the air of the combined air flow under the humidity threshold under the given set of air conditions.

13. The air handling system of claim 12, wherein the control system is further configured to: receive information from a published weather report via a network connection; and adjust the amount of fresh air from the external environment based, at least in part, on the information included from the published weather report.

14. The air handling system of claim 8, wherein the control system is further configured to: receive an indication, from a virtual recirculation sensor, of an amount air that is being recirculated through a rack mounted computing device cooled by the air handing system without the recirculated air passing through the air handling system; and adjust a pressure of a portion of the air of the combined airflow that is directed to the rack mounted computing device, based at least in part on the amount of air that is being recirculated.

15. A method, comprising:
directing air, across a thermal storage unit of an air handling system comprising a phase change material;
condensing, under a given set of ambient air conditions, water vapor from the air as the air passes across the thermal storage unit to lower a relative humidity of the air;
combining the air with the reduced relative humidity with return air to further reduce the relative humidity of the air; and
directing the combined air toward a thermal load to cool the thermal load.

16. The method of claim 15, further comprising: under another set of ambient air conditions, heating the air passing across the thermal storage unit as the air passes across the thermal storage unit to lower a relative humidity of the air; and directing the heated air with the reduced relative humidity toward the thermal load to cool the thermal load.

17. The method of claim 15, further comprising:
exhausting at least a portion of the return air to an external environment and drawing fresh air into the air handling unit from the external environment to adjust a relative humidity of the combined air directed to the thermal load.

18. The method of claim 15, further comprising: determining the air with the reduced relative humidity exceeds a relative humidity threshold; and in response to determining the relative humidity threshold has been exceeded, increasing an amount of the return air that is combined with the air with the reduced relative humidity to further lower the relative humidity of the combined air.

19. The method of claim 15, further comprising: monitoring an amount of air recirculation through the thermal load, wherein the amount of air recirculation indicates a portion of the combined air that is directed to the thermal load that recirculates through the thermal load without passing through the air handling unit; and adjusting a speed of an air moving device to maintain the amount of the air recirculation below a threshold amount.

\* \* \* \* \*